(12) United States Patent
Izumi

(10) Patent No.: US 7,781,812 B2
(45) Date of Patent: Aug. 24, 2010

(54) SEMICONDUCTOR DEVICE FOR NON-VOLATILE MEMORY AND METHOD OF MANUFACTURING THE SAME

(75) Inventor: Kazutoshi Izumi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/480,906

(22) Filed: Jul. 6, 2006

(65) Prior Publication Data

US 2006/0249768 A1    Nov. 9, 2006

Related U.S. Application Data

(63) Continuation of application No. PCT/JP2004/005302, filed on Apr. 14, 2004.

(51) Int. Cl.
*H01L 29/94* (2006.01)
(52) U.S. Cl. ............... 257/295; 257/296; 257/E27.104
(58) Field of Classification Search ............ 257/213, 257/288, 295, 296, E27.104; 438/49, 98, 438/136, 142, 151, 239, 257, 268
See application file for complete search history.

(56) References Cited

U.S. PATENT DOCUMENTS

| 5,986,299 | A  | * | 11/1999 | Nakamura et al. ......... 257/296 |
| 6,500,678 | B1 | * | 12/2002 | Aggarwal et al. .............. 438/3 |
| 6,548,343 | B1 |   | 4/2003  | Summerfelt et al. |
| 6,611,014 | B1 |   | 8/2003  | Kanaya et al. |
| 2003/0077844 | A1 | * | 4/2003 | Lee ............................. 438/3 |
| 2003/0129847 | A1 | * | 7/2003 | Celii et al. .................. 438/706 |
| 2004/0046185 | A1 | * | 3/2004 | Sashida ..................... 257/200 |

FOREIGN PATENT DOCUMENTS

| JP | 8-22986 A | 1/1996 |
| JP | 2000-82684 A | 3/2000 |
| JP | 2001-244426 A | 9/2001 |
| JP | 2001-284448 | 10/2001 |
| JP | 2001-358309 A | 12/2001 |
| JP | 2004-79596 A | 3/2004 |

* cited by examiner

*Primary Examiner*—Lynne A Gurley
*Assistant Examiner*—Vernon P Webb
(74) *Attorney, Agent, or Firm*—Arent Fox LLP

(57) ABSTRACT

After forming an interlayer insulating film (14) covering a ferroelectric capacitor, a hydrogen diffusion preventing film (18), an etching stopper (19) and an interlayer insulating film (20) are formed. Then, a wiring having a tantalum nitride (TaN) film (21) (barrier metal film) and a copper (Cu) film (22) is formed in the interlayer insulating film (20) by a single damascene method. Thereafter, a wiring having a copper film (29) and a wiring having a copper film (36) and the like are formed by a dual damascene method.

11 Claims, 10 Drawing Sheets

SEMICONDUCTOR DEVICE FOR NON-VOLATILE MEMORY AND METHOD OF MANUFACTURING THE SAME

CROSS-REFERENCE TO RELATED APPLICATION

This nonprovisional application is a continuation application of and claims the benefit of International Application No.: PCT/JP2004/005302, filed Apr. 14, 2004. The disclosure of the prior application is hereby incorporated herein in its entirety by reference.

TECHNICAL FIELD

The present invention relates to a semiconductor device suitable for a non-volatile memory provided with a ferroelectric capacitor and a method of manufacturing the same.

BACKGROUND ART

In a conventional ferroelectric memory, a tungsten (W) plug is mainly used to connect between wiring layers, and an aluminum (Al) wiring is used as wiring.

Although miniaturization has been requested recently, the miniaturization of a ferroelectric memory using the W plug and the Al wiring has limitation from the view point of manufacturing technologies, interlayer capacities and the like.
Patent Document 1
Japanese Patent Application Laid-open No. 2001-284448
Patent Document 2
Japanese Patent Application Laid-open No. 2000-82684

SUMMARY OF THE INVENTION

An object of the present invention is to provide a semiconductor device which can realize high degree of integration without lowering a specific property of a ferroelectric capacitor and a method of manufacturing the same.

When a semiconductor device such as a DRAM or the like without a ferroelectric film is miniaturized, a damascene method using a copper-wiring is adopted. Therefore, if the damascene method were able to be applied to a manufacturing process of a ferroelectric memory as it is, it would be possible to achieve miniaturization of a ferroelectric memory with ease. However, it is impossible to apply the damascene method using a copper-wiring as it is to the manufacture of the ferroelectric memory. The reason is as below.

First, in order to apply the damascene method using a copper-wiring, a low dielectric film is formed as an interlayer insulating film to reduce a capacitance between wirings. As the low dielectric film, for example, a spin on glass (SOG) film, a hydrogen silsesquioxane (HSQ) film, or the like is used. When such a low dielectric film is formed, a large quantity of hydrogen or moisture is used. However, the specific properties of the ferroelectric film are remarkably deteriorated by mixing hydrogen and moisture. Therefore, it is difficult to apply the damascene method using copper-wiring.

Second, there is a problem stemming from contact between a material composing an electrode of a ferroelectric capacitor and copper.

The inventor has come up with the invention described below as a result of repeated earnest studies to realize miniaturization of the ferroelectric memory avoiding these problems.

In the method of manufacturing a semiconductor device according to the present invention, after a ferroelectric capacitor is formed above a semiconductor substrate, a first interlayer insulating film covering the ferroelectric capacitor is formed. Next, a hydrogen diffusion preventing film is formed above the first interlayer insulating film. Then, an etching stopper film is formed on the hydrogen diffusion preventing film. Thereafter, a second interlayer insulating film is formed on the etching stopper film. Then, wiring embedded into the second interlayer insulating film, containing copper, and connected to the ferroelectric capacitor, is formed.

DETAILED DESCRIPTION OF THE PREFERRED EMBODIMENT

Figure 1:
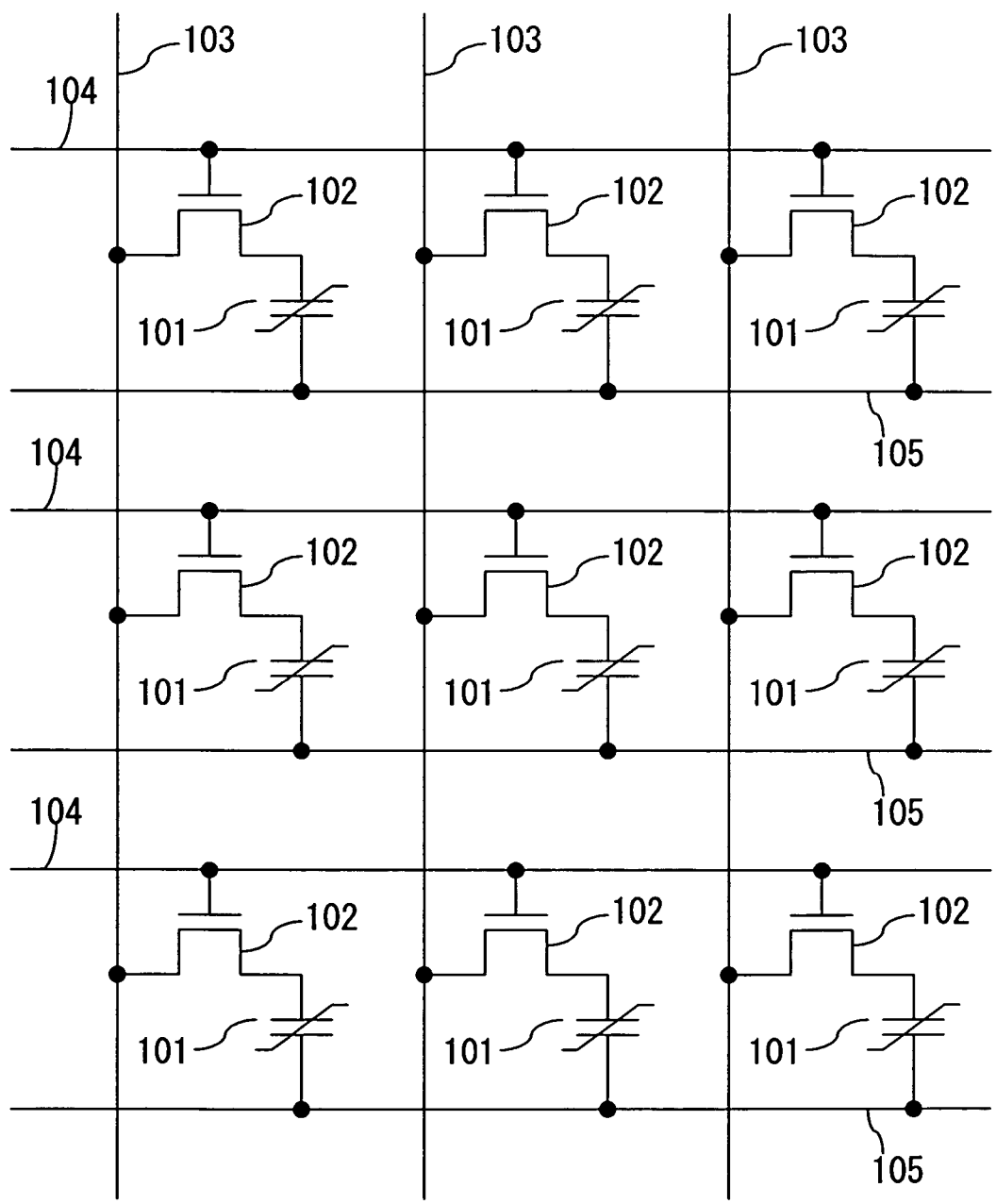
FIG. 1 is a circuit diagram showing a configuration of a memory cell array of a ferroelectric memory (semiconductor device) manufactured by a method according to an embodiment of the present invention.

Hereinafter, an embodiment of the present invention will be explained concretely referring to the attached drawings. FIG. 1 is a circuit diagram showing a configuration of a memory cell array of a ferroelectric memory (semiconductor device) manufactured by a method according to an embodiment of the present invention.

The memory cell array is provided with plural pieces of bit lines 103 extending in a direction, and plural pieces of word lines 104 and plate lines 105 extending in a direction perpendicular to the direction in which the bit lines 103 extend. Plural memory cells of the ferroelectric memory according to the present embodiment are arranged in array so as to match with lattices formed by these bit lines 103, word lines 104 and the plate lines 105. Each memory cell is provided with a ferroelectric capacitor 101 and a MOS transistor 102.

A gate of the MOS transistor 102 is connected to the word line 104. A source/drain of the MOS transistor 102 is connected to the bit line 103, and the other source/drain is connected to an electrode of the ferroelectric capacitor 101. The other electrode of the ferroelectric capacitor 101 is connected to the plate line 105. It should be noted that each word line 104 and the plate line 105 are used in common by a plurality of MOS transistors 102 aligned in the same direction as the extending direction of these lines. Similarly, each bit line 103 is used in common by a plurality of MOS transistors 102 aligned in the same direction as its extending direction. The direction along which the word line 104 and the plate line 105 extend and the direction along which the bit line 103 extends are sometimes called a row direction and a column direction respectively. However, the arrangement of the bit lines 103, the word lines 104 and the plate lines 105 is not limited to that described above.

In the memory cell array of the ferroelectric memory configured thus, data are stored according to the polarization state of a ferroelectric film provided in the ferroelectric capacitor 101.

Figure 2A:
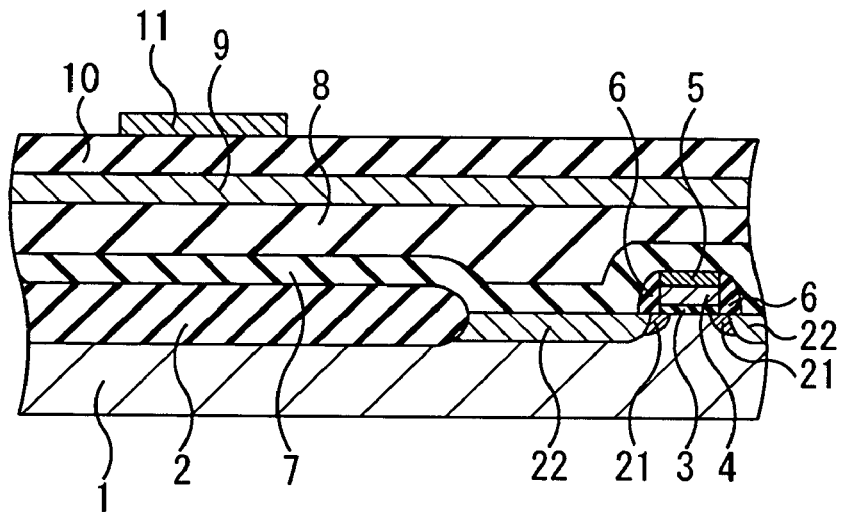
FIGS. 2A to 2P are sectional views showing a method of manufacturing a ferroelectric memory according to the embodiment of the present invention.

A method of manufacturing a ferroelectric memory (semiconductor device) according to an embodiment of the present invention will be explained next. However, a sectional structure of each memory cell will be explained together with the manufacturing method thereof for convenience' sake. FIGS. 2A to 2P are sectional views showing the method of manufacturing the ferroelectric memory according to an embodiment of the present invention in process order.

In the present embodiment, first, a device isolation insulating film 2 defining device activation regions is formed on the surface of a semiconductor substrate 1 such as a silicon substrate or the like by, for example, a local oxidation of silicon (LOCOS) method, as shown in FIG. 2A. Then, a MOS transistor (MOSFET) provided with a gate insulating film 3, a gate electrode 4, a silicide layer 5, a side wall 6, and a source/drain diffusion layer composed of a low density diffusion layer 21 and a high density diffusion layer 22 is formed in the device activation region defined by the device isolation insulating film 2. Then, a silicon oxynitride film 7 is formed on all over the surface to cover the MOSFET, and a silicon oxide film 8 is further formed on all over the surface thereof. The silicon oxynitride film 7 is formed to prevent hydrogen deterioration of the gate insulating film 3 and the like when the silicon oxide film 8 is formed.

Then, a bottom electrode film 9 and a ferroelectric film 10 are formed in sequence on the silicon oxide film 8. The bottom electrode film 9 is composed of, for example, a titanium (Ti) film and a platinum (Pt) film formed thereon. The ferroelectric film 10 is composed of, for example, PZT (Pb (Zr, Ti) $O_3$) film. Then, crystallization annealing of the ferroelectric film 10 is carried out. Then, a top electrode film is formed on the ferroelectric film 10, and a top electrode 11 is formed by patterning the top electrode film. The top electrode 11 is composed of, for example, an $IrO_x$ film. Then, oxygen annealing to recover damage due to patterning by using etching is carried out.

Figure 2B:
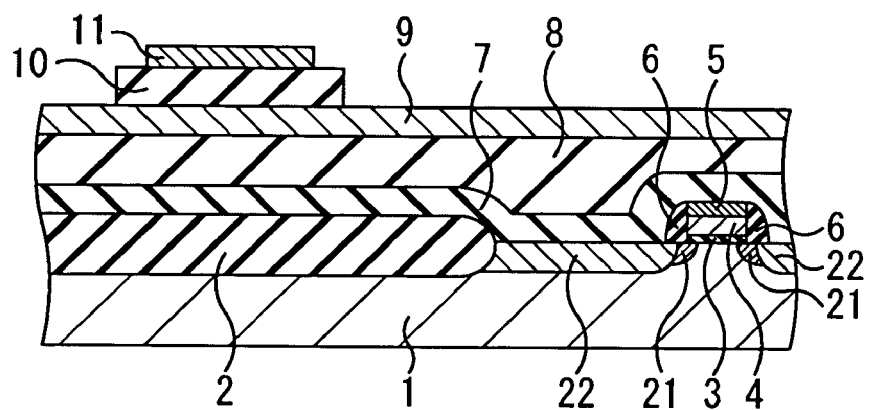

Thereafter, as shown in FIG. 2B, a capacitor insulating film is formed by patterning the ferroelectric film 10. Then, oxygen annealing for prevention of peeling off is carried out.

Figure 2C:
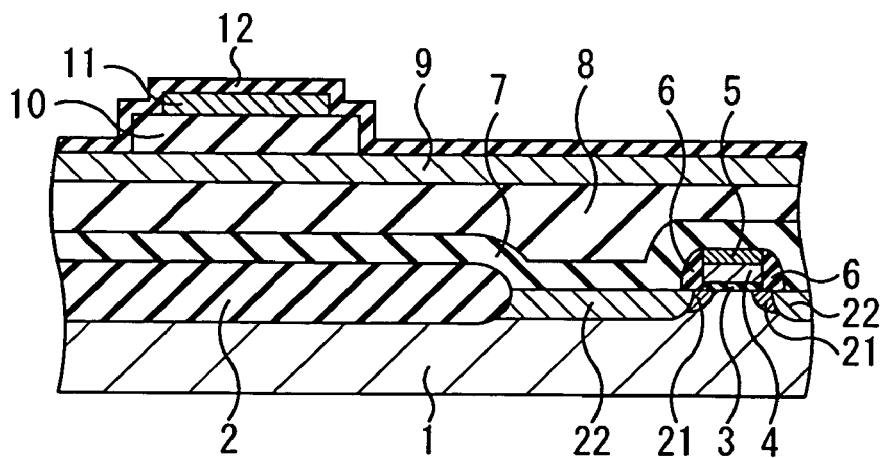

Next, as shown in FIG. 2C, an $Al_2O_3$ film 12 is formed on overall surface as a protection film by a sputtering method. Then, oxygen annealing is carried out to relax damages caused by the sputtering. The protection film (the $Al_2O_3$ film 12) works to prevent invasion of hydrogen from outside into the ferroelectric capacitor.

Figure 2D:
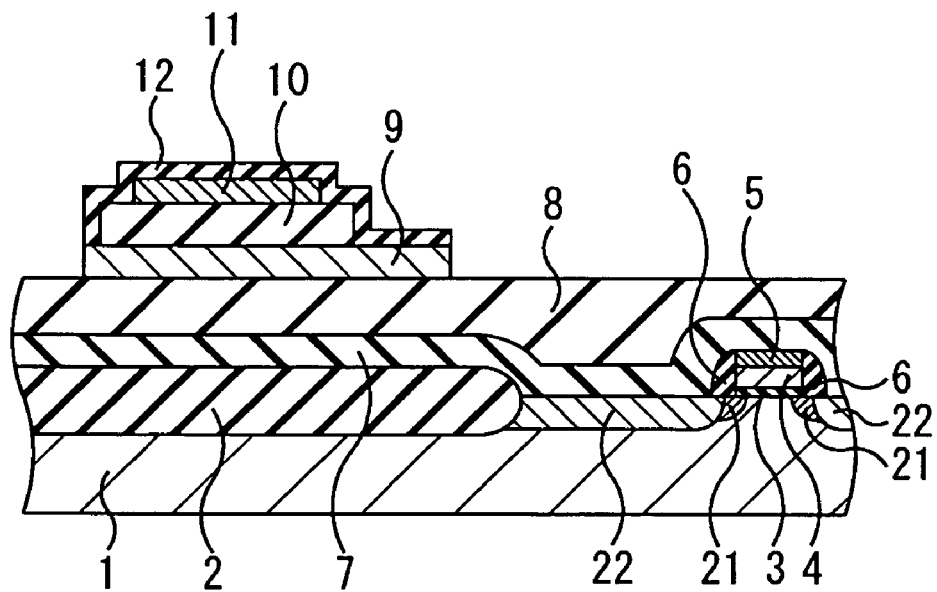

Thereafter, as shown in FIG. 2D, a bottom electrode is formed by patterning the $Al_2O_3$ film 12 and the bottom electrode film 9. Then oxygen annealing for prevention of peeling off is performed.

Figure 2E:
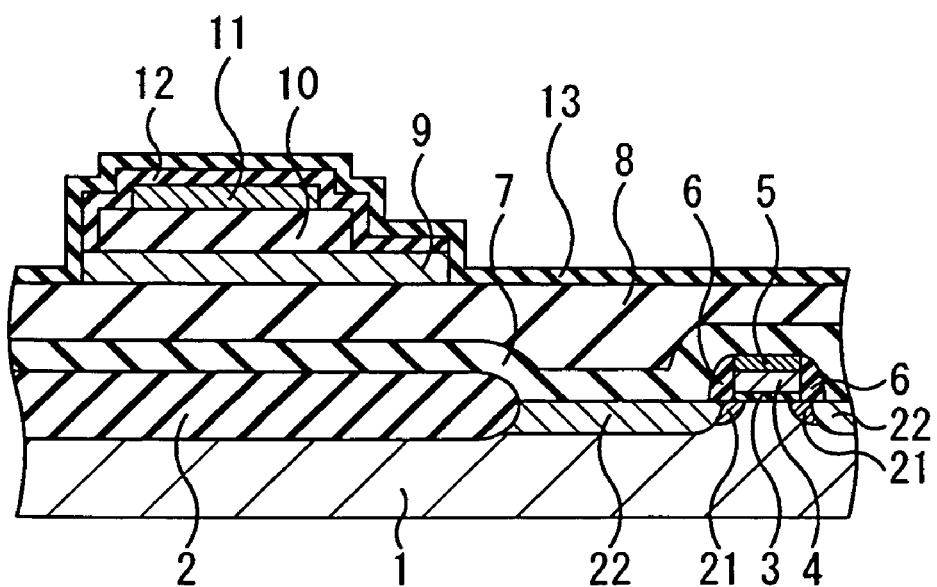

Then, as shown in FIG. 2E, an $Al_2O_3$ film 13 is formed on overall surface as a protection film by a sputtering method. Then, oxygen annealing is performed to reduce capacitor leakage.

Figure 2F:
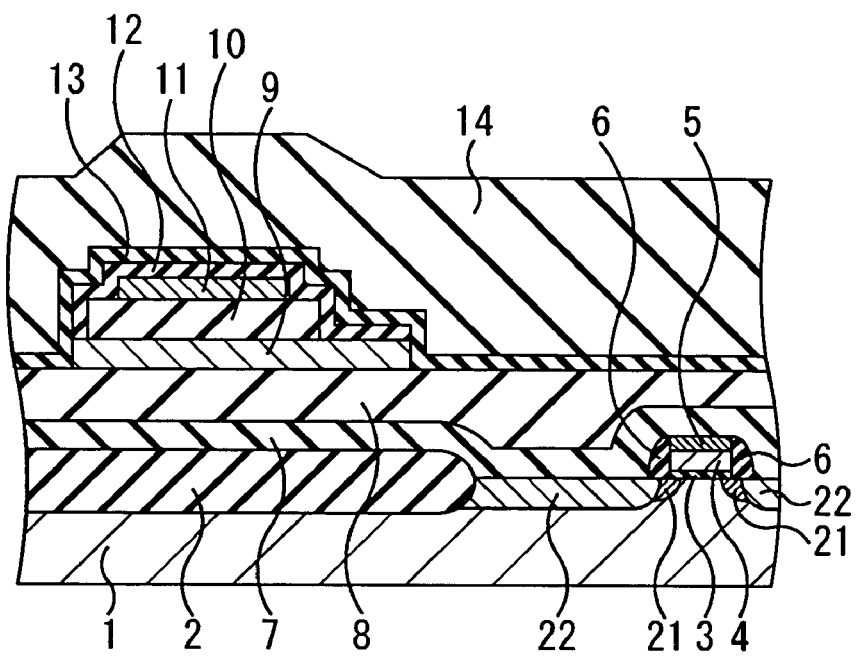

Thereafter, as shown in FIG. 2F, an interlayer insulating film 14 is formed on overall surface with a high density plasma CVD method. The thickness of the interlayer insulating film 14 is made about, for example, 1.5 μm. It should be noted that the interlayer insulating film 14 made from silicon oxide can be formed by a plasma CVD method using TEOS.

Figure 2G:
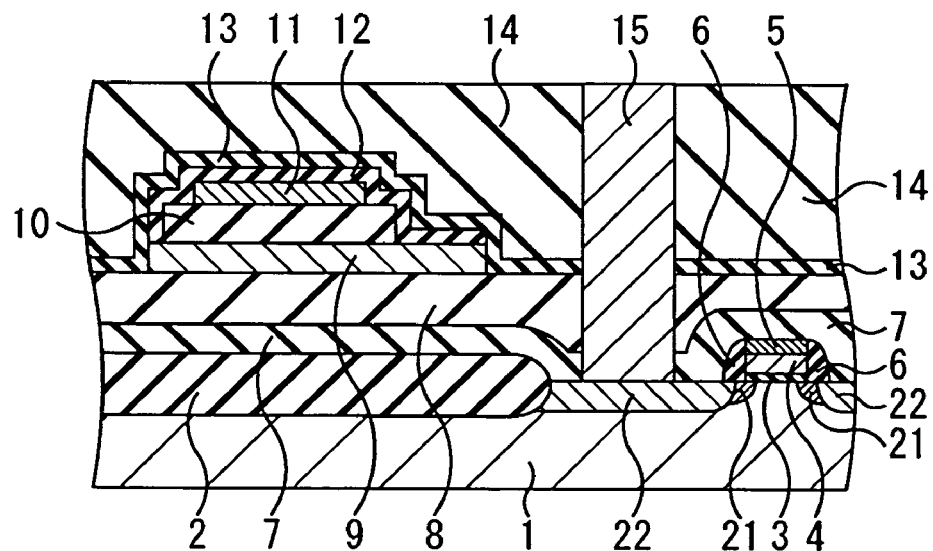

Then, as shown in FIG. 2G, flattening of the interlayer insulating film 14 is carried out by a chemical mechanical polishing (CMP) method. Next, a plasma treatment using $N_2O$ gas is performed. As a result, a surface layer portion of the interlayer insulating film 14 is somewhat converted into nitride so that it becomes difficult for moisture to penetrate inside. Note that the plasma treatment is effective so far as gas containing at least either nitrogen or oxygen is used. Then, a hole reaching the high density diffusion layer 22 of the transistor is formed in the interlayer insulating film 14, the $Al_2O_3$ film 13, the silicon oxide film 8, and the silicon oxynitride film 7. Thereafter, a barrier metal film (not shown) is formed by forming a titanium (Ti) film and a titanium nitride (TiN) film successively in the hole by a sputtering method. Then, a tungsten (W) film is further embedded in the hole by a chemical vapor deposition (CVD) method and a tungsten (W) plug 15 is formed by flattening the tungsten (W) film using a chemical mechanical polishing (CMP) method. Note that the barrier metal film may contain only a titanium nitride (TiN) film or may contain a tantalum nitride (TaN) film and a titanium nitride (TiN) film.

Figure 2H:
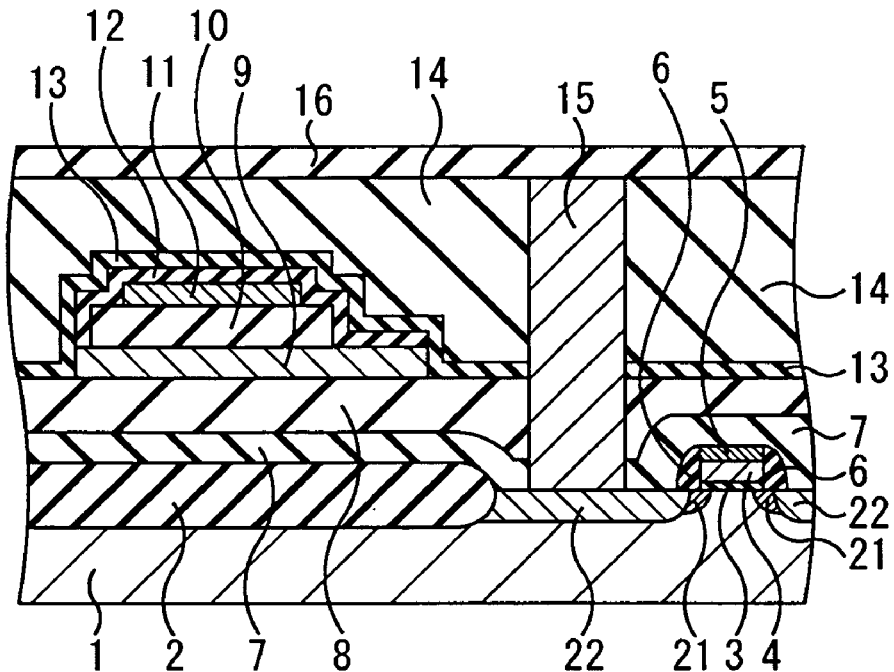

Next, as shown in FIG. 2H, a silicon oxynitride (SiON) film 16 is formed as an antioxidant film of the tungsten (W) plug 15 by, for example, a plasma enhanced CVD method.

Figure 2I:
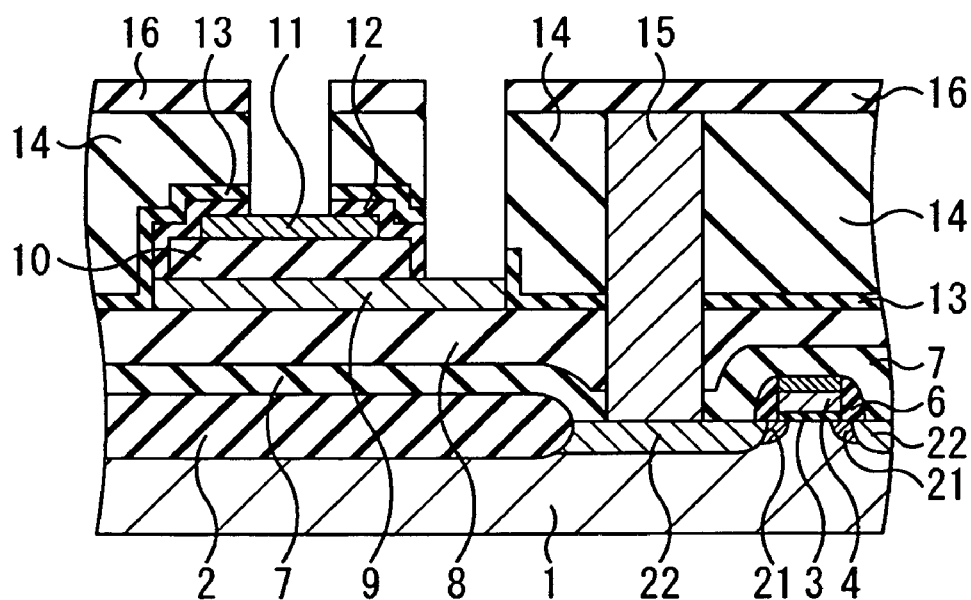

Then, as shown in FIG. 2I, a hole reaching the top electrode 11, and a hole reaching the bottom electrode (the bottom electrode film 9) are formed in the SiON film 16, the interlayer insulating film 14, the $Al_2O_3$ film 13, and the $Al_2O_3$ film 12. Thereafter, oxygen annealing is carried out to recover damages.

Figure 2J:
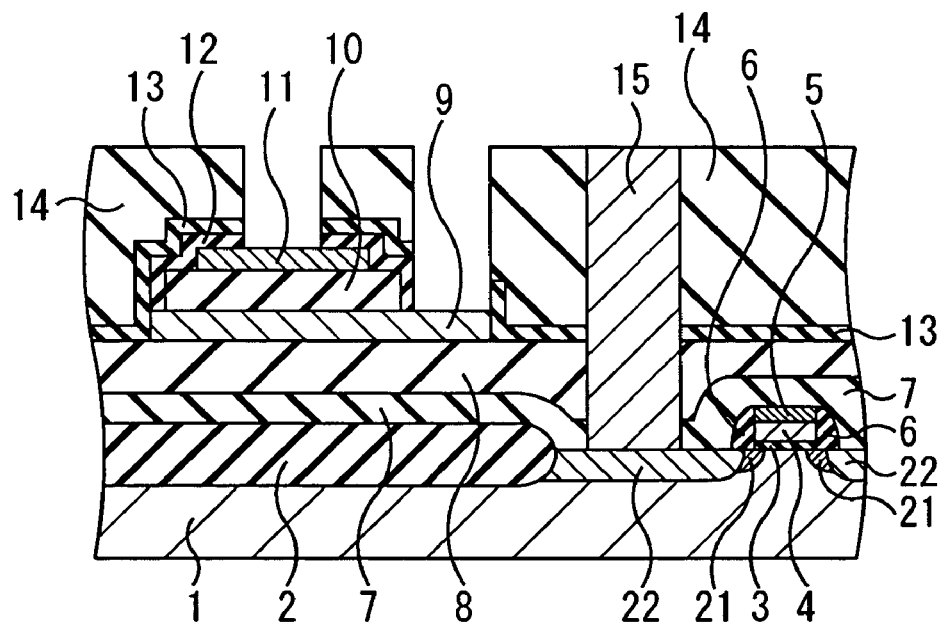
Figure 2K:
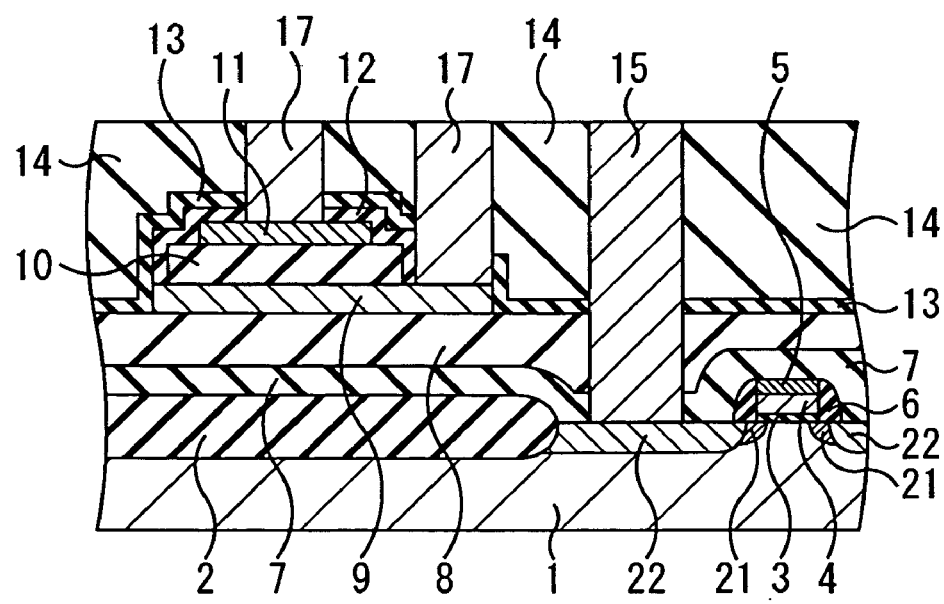
Figure 2L:
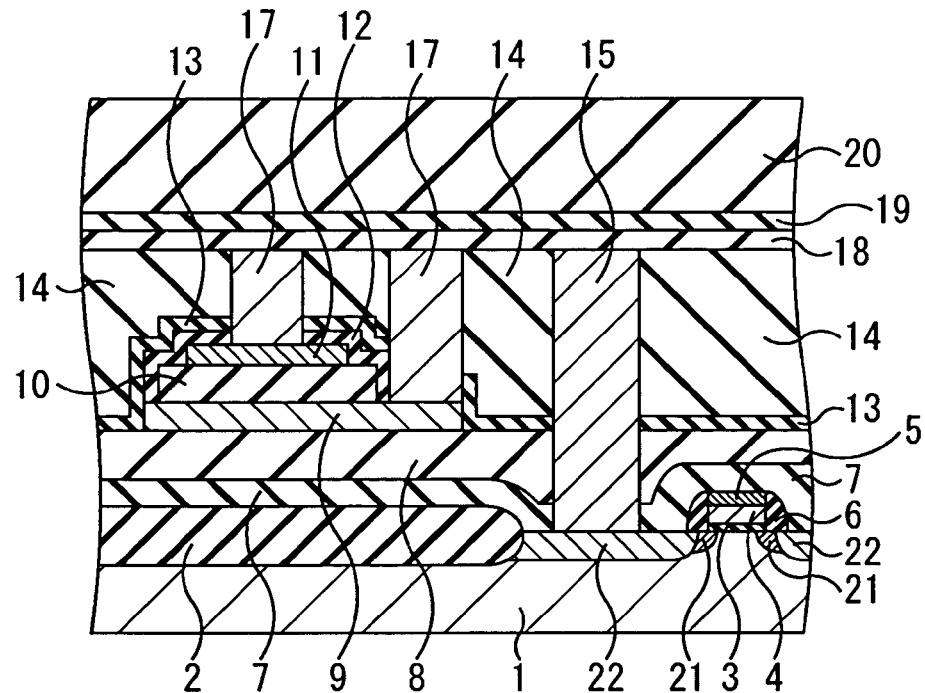

Then, as shown in FIG. 2J, the surface of tungsten (W) plug 15 is exposed by removing the SiON film 16 from overall surface by etching back. Next, as shown in FIG. 2K, an aluminum (Al) film is formed in a state that a portion of the surface of the top electrode 11, a portion of the surface of the bottom electrode (the bottom electrode film 9), and the surface of the tungsten (W) plug 15 are exposed, and the aluminum (Al) wirings 17 are formed by performing flattening of the aluminum (Al) film till the surface of the interlayer insulating film 14 is exposed.

Thereafter, aiming at recovering deterioration of the specific properties of the ferroelectric capacitor, recovering annealing is performed at 400° C. to 600° C. in an atmosphere containing oxygen and/or nitrogen, for example.

Then, a hydrogen diffusion preventing film 18, an etching stopper film 19 and an interlayer insulating film 20 are formed over a whole surface in succession. As the hydrogen diffusion preventing film 18, for example, an aluminum oxide film, an aluminum nitride film, a tantalum oxide film, a tantalum nitride film, a titanium oxide film, a zirconium oxide film, or the like can be formed. The thickness of the hydrogen diffusion preventing film 18 is set to be, for example, about 5 nm to 100 nm. The hydrogen diffusion preventing film 18 can also be formed by, for example, a physical vapor deposition (PVD) method or a metal-organic chemical vapor deposition (MOCVD) method. As the etching stopper 19, for example, a silicon nitride film or a silicon oxide film using tetraethyl orthosilicate (TEOS) or the like can be formed by a plasma enhanced CVD method. When the silicon nitride film is formed, it is preferable to adopt a mono cycle or double cycle plasma enhanced CVD method. This is because deterioration of the specific property of the already formed ferroelectric film 10 can be easily restrained when the mono cycle or double cycle plasma enhanced CVD method is adopted. As the interlayer insulating film 20, it is preferable to form an SiON film by, for example, a plasma CVD method. This is because when the SiON film is formed by the plasma CVD method, mixing of hydrogen and moisture can be restrained. In addition, since the SiON film is a film having low dielectric, it is also possible to keep parasitic capacitance between wiring to be low. It should be noted that formation of a silicon oxide film as the interlayer insulating film 20 by a plasma CVD method using TEOS can be adopted, and formation of a non-doped silicate glass (NSG) film by a high density plasma CVD method or a normal pressure CVD method using TEOS and $O_3$ can be adopted.

It should be noted that before formation of the hydrogen diffusion preventing film 18 and/or before formation of the etching stopper film 19, plasma treatment using $N_2$ gas or $N_2O$ gas is preferably performed at 200° C. to 450° C. By performing such plasma treatment, moisture is released from the film already formed, and at the same time, the surface layer of the film is somewhat nitrified, and it becomes difficult for moisture to penetrate in the inside.

Figure 2M:
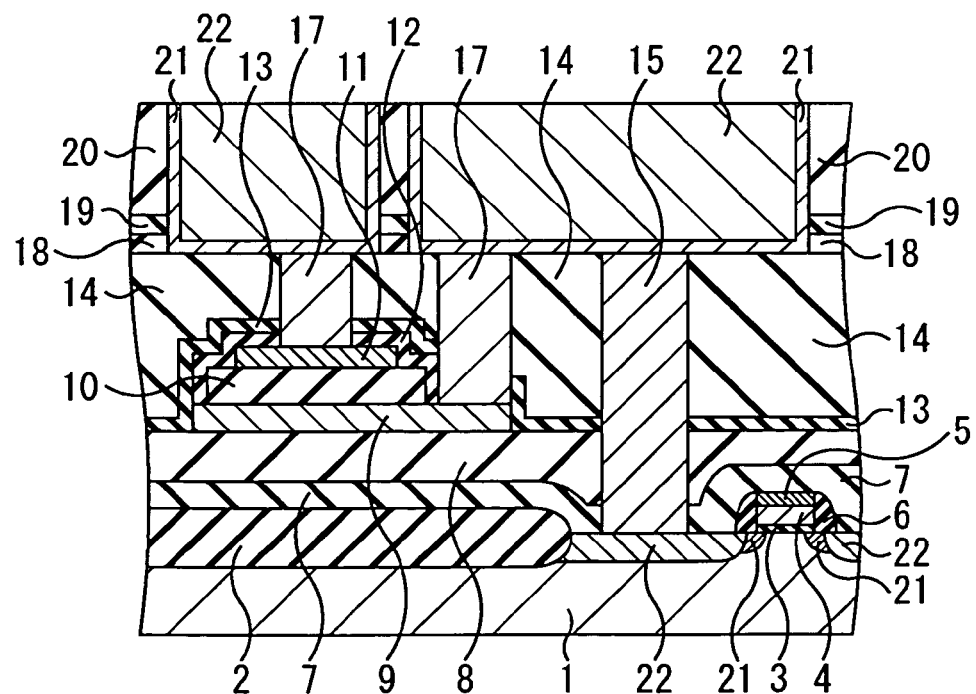

Thereafter, as shown in FIG. 2M, using a single damascene method, grooves are formed in the interlayer insulating film 20, the etching stopper film 19, and the hydrogen diffusion preventing film 18 in succession, and wirings are formed in the inside thereof. When the wiring is formed, as shown in FIG. 2M, after a tantalum nitride (TaN) film 21 is formed on the side wall portion and on the bottom portion of the groove as a barrier metal film, a copper seed layer is formed thereon, and a copper film 22 is embedded by a plating method. Then, the copper film 22 is flattened by a CMP method.

Figure 2N:
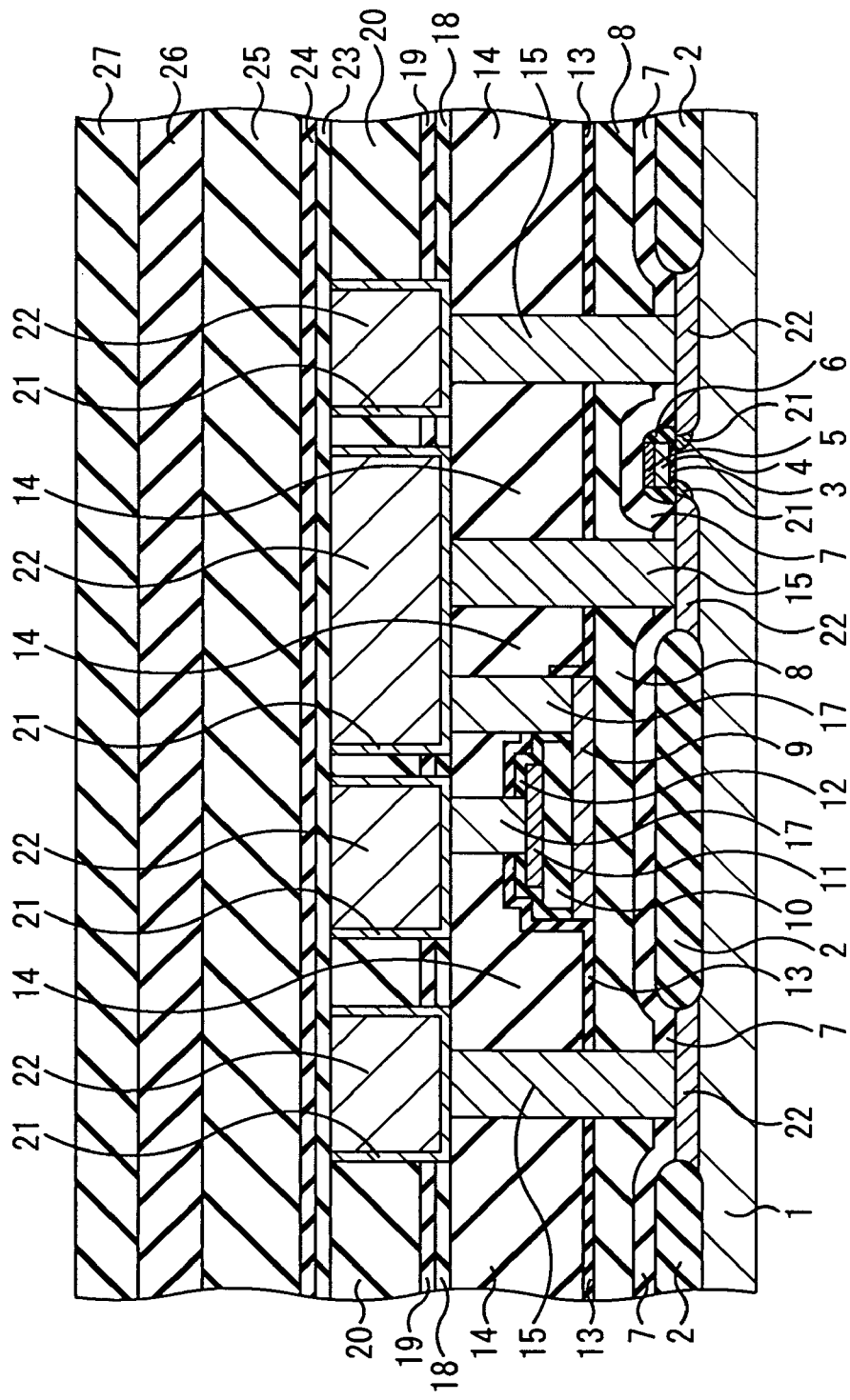

Then, as shown in FIG. 2N, a hydrogen diffusion preventing film 23, an etching stopper film 24 and interlayer insulating films 25 to 27 are formed above all over the surface in succession. As the hydrogen diffusion preventing film 23, for example, a similar film to the hydrogen diffusion preventing film 18 is formed, and as the etching stopper film 24, for example, a similar film to the etching stopper film 19 is formed. As the interlayer insulating films 25 and 27, for example, SiON films are formed by a plasma CVD method, and as the interlayer insulating film 26, for example, an HSQ film is formed.

Figure 2O:
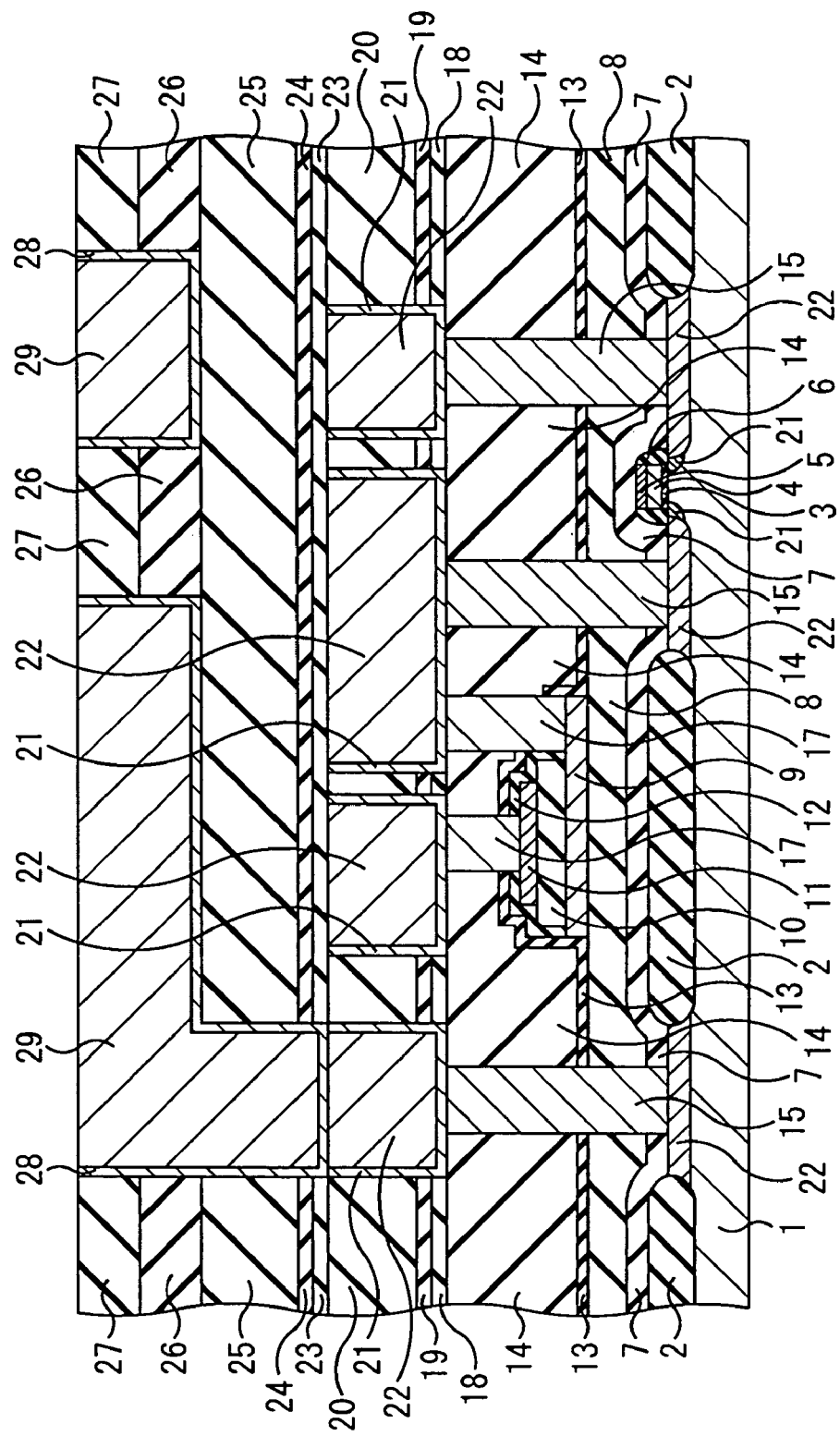
Figure 2P:
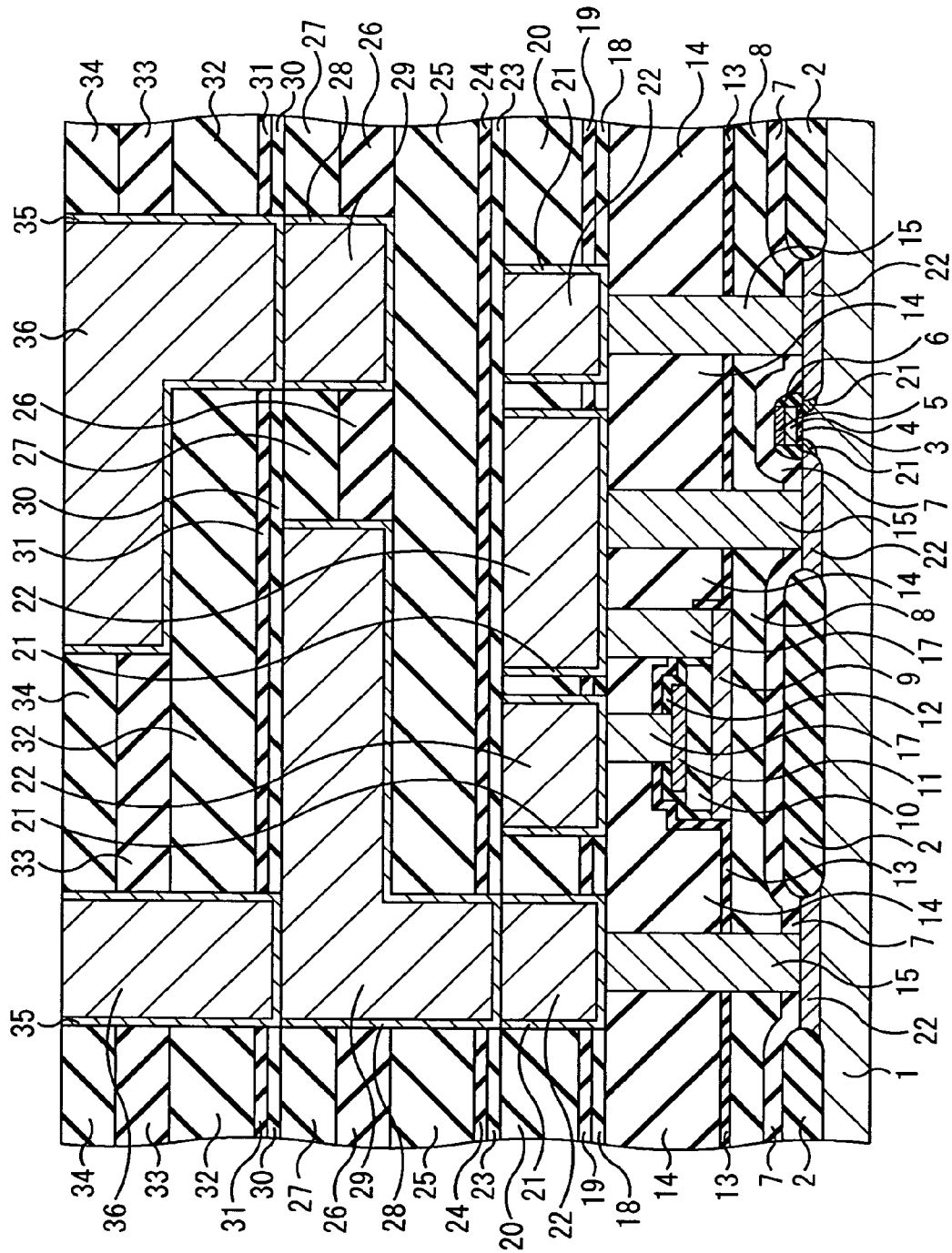

Next, as shown in FIG. 2O, by adopting a dual damascene method, grooves and contact holes are formed in the interlayer insulating films 27 to 25, the etching stopper film 24, and the hydrogen diffusion preventing film 23, and wirings are formed in the inside of the grooves and contact holes. When the wirings are formed, as shown in FIG. 2O, after tantalum nitride (TaN) films 28 are formed on the side wall portions and on the bottom portions of the grooves and the contact holes as barrier metal films, copper seed layers are formed thereon, and copper films 29 are embedded by a plating method. Then, the copper films 29 are flattened by a CMP method.

Thereafter, as shown in FIG. 2P, a hydrogen diffusion preventing film 30, an etching stopper film 31 and interlayer insulating films 32 to 34 are formed similarly to the hydrogen diffusion preventing film 23, the etching stopper film 24, and the interlayer insulating films 25 to 27. Further, grooves and contact holes are formed in these, and wirings provided with a tantalum nitride film 35 and a copper film 36 are formed in the inside of the grooves and contact holes similarly to the wirings provided with the tantalum nitride film 28 and the cupper film 29.

Thereafter, interlayer insulating films, wirings on further upper layers, and the like are formed. The number of layers of the wirings is not limited. A cover film made from, for example, a TEOS oxide film and a silicon nitride film is formed so that a ferroelectric memory having a ferroelectric capacitor is accomplished.

According to the present embodiment, it is possible to realize miniaturization and speeding up of the ferroelectric memory by using copper wiring and a low dielectric film. Moreover, when adopting a damascene process, since the hydrogen diffusion preventing films are formed under the etching stopper films, deterioration of the ferroelectric capacitor can be restrained even when a film containing relatively large amount of hydrogen and moisture is used.

Although a planar type ferroelectric capacitor is manufactured in the above-described embodiment, the present invention can be applied to a stack type ferroelectric capacitor. In such a case, for example, a portion of a contact plug such as a tungsten (W) plug or the like which is connected to a transistor such as a MOSFET or the like is connected to a bottom electrode of the ferroelectric capacitor.

In addition, the material of the ferroelectric film is not limited to PZT, and it is also possible to use, for example, PZT doped with calcium, strontium, lanthanum, niobium, tantalum, iridium, and/or tungsten. It is also adoptable to form a film made of SBT series materials or a film from bismuth (Bi) layer series other than PZT series films.

The structure of a ferroelectric memory cell is not limited to a 1T1C type but can be a 2T2C type.

The plug to be embedded into the contact hole reaching the electrode of the ferroelectric capacitor can be a tungsten plug. However, in this case, it is preferable to use a barrier metal film including a titanium (Ti) film and a titanium nitride (TiN) film, the one including a titanium nitride (TiN) film only, or the one including a tantalum nitride film and a titanium nitride film.

The method of forming a copper (Cu) film used for the copper wiring is not limited to a plating method, and, for example, the PVD method or the CVD method can be adopted.

INDUSTRIAL APPLICABILITY

As detailed above, according to the present invention, even when a wiring containing copper (Cu) is used and a low dielectric film is used as the interlayer insulating film in order to miniaturize, it is possible to restrain deterioration of the specific properties of a ferroelectric capacitor caused by diffusion of hydrogen and moisture owing to the existence of a hydrogen diffusion preventing film. In particular, it is suitable for a semiconductor device adopting a wiring rule less than 0.18 μm accompanying by miniaturization and the manufacturing method thereof.

What is claimed is:

1. A method of manufacturing a semiconductor device, comprising:
    forming a ferroelectric capacitor above a semiconductor substrate;
    forming a first interlayer insulating film covering said ferroelectric capacitor;
    forming a first wiring connected to an electrode of said ferroelectric capacitor, not containing copper, in said first interlayer insulating film;
    forming a hydrogen diffusion preventing film over said first interlayer insulating film and said first wiring;
    forming an etching stopper film formed over said hydrogen diffusion preventing film;
    forming a second interlayer insulating film directly on said etching stopper film so as to be in physical contact with said etching stopper film, wherein said second interlayer insulating film is a low dielectric film;
    forming a groove in said second interlayer insulating film, said etching stopper film, and said hydrogen diffusion preventing film so as to expose a surface of said first wiring; and
    forming a second wiring in the groove and embedded into said second interlayer insulating film, containing copper, and connected to said ferroelectric capacitor via said first wiring.

2. The method of manufacturing a semiconductor device according to claim 1, wherein a film selected from a group consisting of an aluminum oxide film, an aluminum nitride film, a tantalum oxide film, a tantalum nitride film, a titanium oxide film, and a zirconium oxide film is formed as said hydrogen diffusion preventing film.

3. The method of manufacturing a semiconductor device according to claim 1, wherein a silicon oxide nitride is formed as said second interlayer insulating film.

4. The method of manufacturing a semiconductor device according to claim 1, further comprising the step of, before forming said ferroelectric capacitor, forming a transistor to which one of electrodes of said ferroelectric capacitor is connected on the surface of said semiconductor substrate.

5. The method of manufacturing a semiconductor device according to claim 4, wherein said second wiring containing copper is connected to an electrode of said transistor.

6. The method of manufacturing a semiconductor device according to claim 1, wherein said second wiring containing copper is connected to an electrode of said ferroelectric capacitor via a barrier metal film.

7. The method of manufacturing a semiconductor device according to claim 6, wherein a film including a tantalum nitride film is formed as said barrier metal film.

8. The method of manufacturing a semiconductor device according to claim 1, wherein a silicon nitride film is formed by a monocycle or double cycle plasma enhanced CVD method as said etching stopper film.

9. The method of manufacturing a semiconductor device according to claim 1, further comprising the step of, between forming said first interlayer insulating film and forming said hydrogen diffusion preventing film, performing plasma treatment at 200° C. to 450° C. to said first wiring using gas containing at least either nitrogen or oxygen.

10. The method of manufacturing a semiconductor device according to claim 1, further comprising the step of, between forming said hydrogen diffusion preventing film and forming said etching stopper film, performing plasma treatment at 200° C. to 450° C. to said hydrogen diffusion preventing film using gas containing at least either nitrogen or oxygen.

11. The method of manufacturing a semiconductor device according to claim 1, further comprising the steps of, between forming said first interlayer insulating film and forming said hydrogen diffusion preventing film:

forming a plug connected to an electrode of said ferroelectric capacitor; and performing annealing treatment at 400° C. to 600° C. in an atmosphere containing at least either nitrogen or oxygen.

* * * * *